(12) United States Patent
Shoyama

(10) Patent No.: US 6,587,993 B2
(45) Date of Patent: Jul. 1, 2003

(54) METHOD OF DESIGNATING OUTPUT "DON'T CARE" AND PROCESSOR OF PROCESSING LOGIC CIRCUIT DATA

(75) Inventor: Hideki Shoyama, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 236 days.

(21) Appl. No.: 09/760,624

(22) Filed: Jan. 16, 2001

(65) Prior Publication Data

US 2001/0013112 A1 Aug. 9, 2001

(30) Foreign Application Priority Data

Jan. 13, 2000 (JP) ........................................ 2000-004731

(51) Int. Cl.[7] ............................................... G06F 17/50
(52) U.S. Cl. ...................... 716/3; 716/3; 716/1; 716/18
(58) Field of Search ............................... 716/1, 2, 3, 5, 716/7, 6, 18; 704/270; 714/763

(56) References Cited

U.S. PATENT DOCUMENTS

| | | | | |
|---|---|---|---|---|
| 5,631,915 A | * | 5/1997 | Meaney et al. | 714/763 |
| 5,867,818 A | * | 2/1999 | Lam | 704/270 |
| 6,056,784 A | * | 5/2000 | Stanion | 716/5 |
| 6,226,777 B1 | * | 5/2001 | Zhang | 716/5 |
| 6,247,163 B1 | * | 6/2001 | Burch et al. | 716/3 |
| 6,301,687 B1 | * | 10/2001 | Jain et al. | 716/3 |
| 6,336,206 B1 | * | 1/2002 | Lockyear | 716/7 |

FOREIGN PATENT DOCUMENTS

| | | |
|---|---|---|
| JP | 6-68194 | 3/1994 |
| JP | 9-128431 | 5/1997 |
| JP | 9-319782 | 12/1997 |
| JP | 10-269256 | 10/1998 |
| JP | 11-3361 | 1/1999 |

* cited by examiner

Primary Examiner—Vuthe Siek
Assistant Examiner—Binh C Tat
(74) Attorney, Agent, or Firm—Choate, Hall & Stewart

(57) ABSTRACT

A method of designating an output "don't care", includes the steps of reading (21) first data about a logic circuit in which outputs associated a plurality of inputs are described, reading (22) "don't care" indicating data which outputs a predetermined logic value in response only to a specific input among the plurality of inputs, converting (23) the first data into second data having a form conforming to an application, converting (24) the "don't care" indicating data into third data having the form, coupling (25) the plurality of inputs in the second data to associated inputs in the third data, and detecting (26) an output in the second data which output is associated with an input in response to which the predetermined logic value is output from the "don't care" indicating data.

12 Claims, 15 Drawing Sheets

FIG. 14A

```
case (signal1)
    AA:         a=b+c;
    BB:         a=b*c;
    CC:         a=b/c;
    DD:         a=b%c;
    DEFAULT:    a=x;
endcase
```
91

FIG. 14B

```
case (signal1)
    DD:         a=1;
    DEFAULT:    a=0;
endcase
```
92

FIG. 14C

```
case (signal1)
    AA:         a=b+c;
    BB:         a=b*c;
    CC:         a=b/c;
    DD:         a=x;
    DEFAULT:    a=x;
endcase
```
93

METHOD OF DESIGNATING OUTPUT "DON'T CARE" AND PROCESSOR OF PROCESSING LOGIC CIRCUIT DATA

BACKGROUND OF THE INVENTION

1. Field of the Invention

The invention relates to a method of designating an output "don't care" in logic circuit data, an apparatus for doing the same, a processor for carrying out an equivalency test or synthesizing logics, and a method of carrying out an equivalency test or synthesizing logics, and more particularly to such a method, an apparatus and a processor all suitable for effectively carrying out an equivalency test for logic circuit data and effectively producing logic circuit data used for logic synthesis. The invention relates further to a recording medium readable by a computer, storing a program therein for causing a computer to carry out the above-mentioned methods or act as the above-mentioned apparatus or processor.

2. Description of the Related Art

Various methods have been suggested for testing equivalency between two logic circuits. In one of such methods, two logic circuits are converted into logic functions, and those logic functions are judged as to whether they are equivalent to each other.

FIG. 1 is a block diagram of a conventional system for carrying out an equivalency test.

The illustrated system is accomplished by a computer operating in accordance with a program. Specifically, the illustrated system is comprised of a graphic display 1, a keyboard 2, a mouse 3, an external memory 4, and a tester 101. The tester 101 is comprised of an input unit 102 including a logic circuit data reader 105 and a data form converter 106, an equivalency tester 103, and an internal database 104.

The logic circuit data reader 105 reader reads both logic circuit data used as reference data in judgment of equivalency with other data and logic circuit data judged as to whether equivalent to the reference data, out of the external memory 4, and stores the thus read-out logic circuit data into the internal database 104. Hereinafter, logic circuit data used as reference data in judgment of equivalency with other data is referred to as "reference logic circuit data", and logic circuit data which is to be judged as to whether it is equivalent to the reference logic circuit data by comparing to the reference logic circuit data is referred to as "tested logic circuit data". Both the reference and tested logic circuit data are described by HDL which is a language by which a hardware is described, logic formula, a table of truth value, data about gate level connection, and so on.

The reference and tested logic circuit data are read out of the internal database 104, and are converted by the data form converter 106 into data having a form conforming to an equivalency test carried out by the equivalency tester 103. The thus converted reference and tested logic circuit data are judged by the equivalency tester 13 as to whether they are logically equivalent to each other.

In a usual case wherein an equivalency test is carried out to gate-leveled

In a usual case wherein an equivalency test is carried out to gate-leveled logic circuit data logically synthesized from register/transfer-leveled original logic circuit data, the register/transfer-leveled original circuit data is used as the reference logic circuit data, and the gate-leveled logic circuit data is tested as to whether it is logically equivalent to the reference logic circuit data by comparing to the register/transfer-leveled original circuit data.

If the reference or tested logic circuit data includes an undefined output "X" among outputs derived therefrom, the equivalency tester 103 judges that the reference and tested logic circuit data are logically equivalent to each other, when the reference logic circuit data outputs an defined value "X", even if the tested logic circuit data outputs an undefined value "X", a logical value "0" or a logical value "1".

On the other hand, when the tested logic circuit data outputs an undefined value "X", the equivalency tester 103 judges that the reference and tested logic circuit data are logically equivalent to each other, only when the reference logic circuit data outputs an undefined value "X", but judges that the reference and tested logic circuit data are not logically equivalent to each other, when the reference logic circuit data outputs a value other than an undefined value "X", such as a logical value "0".

That is, the reference and tested logic circuit data are judged logically equivalent to each other only when both the reference and tested logic circuit data output a logical value either "0" or "1".

However, for instance, when the reference and tested logic circuit data are gate-leveled logic circuit data synthesized from register/transfer-leveled original logic circuit data including "don't care" logic, under different conditions, the reference and tested logic circuit data may not be equivalent to each other in an equivalency test.

Herein, "don't care" logic indicates an output which exerts no influence on results of logical operation carried out by subsequent circuits regardless of a value of an output node.

FIG. 2 illustrates an example of synthesizing logic, based on logic circuit data including "don't care" logic.

In FIG. 2, logic circuit data 112 of a logic circuit (A) produced by logic synthesis on the basis of original logic circuit data 111 under constraint conditions (A) is used as reference logic circuit data, and logic circuit data 113 of a logic circuit (B) produced by logic synthesis on the basis of original logic circuit data 111 under constraint conditions (B) is tested as to whether the logic circuit data 113 is logically equivalent to the logic circuit data 112.

In an equivalency test between the logic circuit data 112 and 113, since an undefined value "X" in the original logic circuit data 111 may be a logical value "0" or "1", the logic circuit data 112 has to be judged logically equivalent to the logic circuit data 113. However, since the logic circuit data 112 and 113 are apparently different from each other, the equivalency test system illustrated in FIG. 1 judges that the logic circuit data 112 and 113 are not equivalent to each other.

In order to avoid such apparent mismatch in logic, caused by "don't care" logic, it is necessary to identify a node having "don't care" logic, and take necessary steps to the thus identified node in order to avoid mismatch in logic.

FIG. 3 is a flow chart of a conventional method of preventing such mismatch in logic, caused by "don't care" logic, and FIGS. 4A and 4B illustrate examples of steps carried out for preventing such mismatch in logic.

Hereinbelow, it is assumed that both reference logic circuit data and tested logic circuit data are described in HDL, and HDL in which reference logic circuit data and tested logic circuit data are described are referred to as reference data HDL and tested data HDL, respectively.

Hereinbelow are explained steps in the method in FIG. 3 with reference to FIGS. 1, 4A and 4B.

With reference to FIG. 3, the logic circuit data reader 105 reads the tested data HDL out of the external memory 4 in step 121. If there is a technology library necessary for mapping a logic circuit described in the tested data HDL, the logic circuit data reader 105 reads the technology library, too.

Then, the logic circuit data reader 105 reads the reference data HDL out of the external memory 4 in the same way as step 121, in step 122.

Then, the data form converter 106 converts the tested data HDL into tested circuit data 131 having a form conforming to an equivalency test carried out in the equivalency tester 103, in step 123.

Then, the data form converter 106 converts the reference data HDL into reference circuit data 133 having a form conforming to an equivalency test carried out in the equivalency tester 103, in step 124.

Then, an operator finds out a node in which "don't care" is established (hereinbelow, such a node is referred to as "don't care node"), in step 125, and designates a logical value or removes the don't care node out of an equivalency test such that the reference circuit data 133 and the tested circuit data 131 are coincident with each other in an equivalency test.

Then, the equivalency tester 103 carries out an equivalency test to judge whether the reference circuit data 133 and the tested circuit data 131 are logically equivalent to each other, in step 126. The results of the equivalency test are transmitted to the graphic display 1 and/or the external memory 4.

However, the above-mentioned method of avoiding mismatch in logic, illustrated in FIG. 3 is accompanied with the following problems.

The first problem is that it takes much time to detect a node of the reference data HDL associated with a node of the tested data HDL. A name of a node of the reference data HDL and a name of a node of the tested data HDL are automatically produced by logic synthesis, based on original logic circuit data HDL. Hence, the nodes are not always named such that an associated node can be readily detected, resulting in that an associated node has to be traced on the basis of an original logic circuit HDL.

The second problem is that designer's knowledge and a great number of steps are required for carrying out an equivalency test to "don't care" logic. It is necessary to designate a logical value "1" or "0" in some cases and to remove a don't care node out of an equivalency test in other cases. That is, knowledge about an operation of the reference and tested logic circuits both produced by logic synthesis is required to do so. If a don't care node is removed out of an equivalency test, it would be impossible to carry out an equivalency test to circuits located downstream of a don't care node.

FIG. 4A illustrates an entirety of a tested logic circuit, and FIG. 4B illustrates an entirety of a reference logic circuit.

Since the tested circuit data 131 and the reference circuit data 133 transmit different outputs C from each other when inputs (A, B) is equal to (0, 1) or (1, 0), the outputs C associated with the inputs have to be dealt with as "don't care". It would be possible to coincide an output $C_C$ transmitted from the tested circuit data 131 and an output $C_R$ transmitted from the reference circuit data 133 with each other and further coincide an output $D_C$ transmitted from an AND circuit 132 in a tested circuit and an output $D_R$ transmitted from an AND circuit 134 in a reference circuit with each other by changing a logical value of the output C associated with the input (A, B)=(0, 1) in the tested circuit data 131, into a logical value "0" and by changing a logical value of the output C associated with the input (A, B)=(1, 0) in the reference circuit data 133, into a logical value "0".

However, an operator could not do so, unless the operator had deep knowledge about an operation of the reference and tested circuits.

Japanese Unexamined Patent Publication No. 11-3361 has suggested a method of carrying out an equivalency test without necessity of manually searching a node in logic circuit data including don't care logic and changing a logical value.

FIG. 5 is a block diagram of a circuit for carrying out the above-mentioned method suggested in Japanese Unexamined Patent Publication No. 11-3361.

The circuit is comprised of a reference circuit 141, a tested circuit 142, a circuit 143 for judging whether logical values transmitted from the reference circuit 141 and the tested circuit 142 are coincident with each other, a "don't care" function 144, and an OR circuit 145.

In operation, outputs transmitted from the reference circuit 141 and the tested circuit 142 are input into the circuit 143, and an output transmitted from the circuit 143 and the "don't care" function 144 are input into the OR circuit 145.

When an output logical value transmitted from the tested circuit 142 and an output logical value transmitted from the reference circuit 141 are coincident with each other in response to a combination of an input logical value A "0" or "1" and an input logical value B "0" or "1", the circuit 143 outputs a logical value "1". The OR circuit 145 transmits a logical value "1" as an output CHK. Hence, it is judged that the reference circuit 141 and the tested circuit 142 are equivalent to each other.

When an output logical value transmitted from the tested circuit 142 is different from an output logical value transmitted from the reference circuit 141, the circuit 143 outputs a logical value "0". However, since the don't care function 144 transmits a logical value "1" to the OR circuit 145, if the outputs transmitted from the circuits 141 and 142 are don't care outputs, the OR circuit 145 transmits a logical value "1" as the output CHK. As a result, it is judged that the reference circuit 141 and the tested circuit 142 are equivalent to each other.

Only when an output logical value transmitted from the tested circuit 142 is different from an output logical value transmitted from the reference circuit 141 and the outputs transmitted from the circuits 141 and 142 are not registered in the don't care function 144 as don't care data, the OR circuit 145 transmits a logical value "0" as the output CHK, resulting in that the reference circuit 141 and the tested circuit 142 are judged not equivalent to each other.

Thus, the method makes it possible to carry out an equivalency test to logic circuit data including don't care logic, without any steps manually performed by an operator.

However, the above-mentioned method suggested in Japanese Unexamined Patent Publication No. 11-3361 is accompanied with a problem that it is necessary that an equivalency test has to be carried out to a circuit in its entirety from an input terminal to an output terminal or a circuit in its entirety from a register to an adjacent register, and hence, it is impossible to divide a circuit into smaller-sized circuits for carrying out an equivalency test.

For instance, if the tested circuit including the tested circuit data 131 and the AND circuit 132, illustrated in FIG. 4A, and the reference circuit including the reference circuit data 133 and the AND circuit 134, illustrated in FIG. 4B, are to be judged whether equivalent to each other in accordance with the above-mentioned method by dividing the tested and reference circuits into unit circuits, the tested circuit data 131 and the reference circuit data 133 are first extracted, and then, the above-mentioned method are applied to the thus extracted data 131 and 133.

Thus, there are obtained results that the output $C_C$ transmitted from the tested circuit data 131 and the output $C_R$ transmitted from the reference circuit data 133 are equivalent to each other.

However, when it is judged as to whether an output transmitted from the AND circuit 132 and an output transmitted from the AND circuit 134 are equivalent to each other, since different input signal names are input into the AND circuits 132 and 134, the outputs transmitted from the AND circuits 132 and 134 are judged not equivalent to each other.

Accordingly, when an equivalency test is to be carried out in accordance with the above-mentioned method, an equivalency test has to be carried out to the tested circuit in its entirety including the tested circuit data 131 and the AND circuit 132 and the reference circuit in its entirety including the reference circuit data 133 and the AND circuit 134. If an equivalency test is to be carried out to divided circuits of the tested or reference circuit, an accuracy in results of an equivalency test is not always ensured.

As mentioned above, the method suggested in Japanese Unexamined Patent Publication No. 11-3361 is accompanied with a problem that an equivalency test has to be carried out per a large unit of a circuit, and hence, if circuits are judged not equivalent to each other in an equivalency test, it would be quite difficult to analyze the reason of no equivalency and identify a non-equivalent part in the tested circuits.

In accordance with the conventional method illustrated in FIGS. 1 to 4B, a node in one of the reference data HDL and the tested data HDL both synthesized on the basis of original circuit HDL could be readily associated with a node in the original circuit HDL. Hence, if "don't care" logic could be readily designated for a "don't care" node in the original circuit HDL, an equivalency test could be carried out without manually changing logic circuit data by removing a "don't care" output out of an equivalency test with respect to a "don't care" node, and transferring an original output to a next stage logic circuit as an input logical value. In addition, an equivalency test could be carried out to divided circuits.

Furthermore, if an operator could readily designate any node as a "don't care" node to thereby designate "don't care" logic, it would be possible to alter design of a "don't care" node and "don't care" logic, resulting in that secondary logic circuit data could be effectively produced by partially removing original logic circuit data.

Japanese Unexamined Patent Publication No. 6-68194 has suggested a method of identifying undefined data out of functional description, comprising the steps of analyzing input functional description and extracting data flow and control data, retrieving substitution relation and reference conditions on the basis of the data flow and the control data, and extracting undefined data on the basis of the reference conditions.

Japanese Unexamined Patent Publication No. 9-128431 has suggested an equivalency testing system for carrying out an equivalency test between two logic circuits each including a sequential circuit, including means for rewriting circuit description of two circuits to be tested, in order to obviously show initial conditions of the circuits. The circuits are judged whether equivalent to each other by comparing circuit description in which the initial conditions are explicitly described.

Japanese Unexamined Patent Publication No. 9-319782 has suggested a method of testing a sequential logic apparatus. The method makes it possible to carry out an equivalency test per a command, and to convert Boolean equation into arithmetic expression.

Japanese Unexamined Patent Publication No. 10-269256 has suggested an equivalency tester for carrying out an equivalency test among a plurality of logic circuits, including first means for producing stationary finite-state machines (FMS) associated with the logic circuits, based on circuit description in which the logic circuits are described, and data about signals input into the logic circuits, an equivalency tester which carries out a logic equivalency test to the stationary finite-state machines, and an output unit which outputs results of the logic equivalency test having been carried out by the equivalency tester.

SUMMARY OF THE INVENTION

In view of the above-mentioned problems in the prior art, it is an object of the present invention to provide a method of designating a "don't care" node and "don't care" logic, which method makes it possible to more readily designate a "don't care" node and "don't care" logic than the conventional methods.

It is also an object of the present invention to provide a method and an apparatus for carrying out an equivalency test.

It is further an object of the present invention to provide a method and an apparatus for synthesizing logic.

In one aspect of the present invention, there is provided a method of designating an output "don't care", including the steps of (a) reading first data about a logic circuit in which outputs associated a plurality of inputs are described, (b) reading "don't care" indicating data which outputs a predetermined logic value in response only to a specific input among the plurality of inputs, (c) coupling the plurality of inputs to associated inputs in the "don't care" indicating data, and (d) detecting an output in the first data which output is associated with the specific input.

There is further provided a method of designating an output "don't care", including the steps of (a) reading first data about a logic circuit in which outputs associated a plurality of inputs are described, (b) reading "don't care" indicating data which outputs a predetermined logic value in response only to a specific input among the plurality of inputs, (c) converting the first data into second data having a form conforming to an application, (d) converting the "don't care" indicating data into third data having the form, (e) coupling the plurality of inputs in the second data to associated inputs in the third data, and (f) detecting an output in the second data which output is associated with an input in response to which the predetermined logic value is output from the "don't care" indicating data.

In another aspect of the present invention, there is provided an apparatus for designating an output "don't care", including (a) a data reader which externally reads (b1) first logic circuit data which is to be judged as to whether equivalent to reference data, (b2) second logic circuit data used as reference data in judgment of equivalency with other data, and (b3) "don't care" indicating data which receives the same inputs as inputs received in the second data and which outputs a predetermined logic value in response only to an input associated with a "don't care" output, (b) a data form converter which converts the first logic circuit data, the second logic circuit data and the "don't care" indicating data into third, fourth and fifth data, respectively, each having a form conforming to an equivalency test, (c) a data coupler which couples an input in the fourth data to an associated input in the fifth data, and (d) an output detector which detects an output in the fourth data which output is associated with an input in response to which the fifth data outputs the predetermined logic value.

In still another aspect of the present invention, there is provided a processor including (a) an internal database storing logic circuit data therein, (b) a data reader which externally reads (b1) first logic circuit data which is to be judged as to whether equivalent to reference data, (b2) second logic circuit data used as reference data in judgment of equivalency with other data, and (b3) "don't care" indicating data which receives the same inputs as inputs received in the second data and which outputs a predetermined logic value in response only to an input associated with a "don't care" output, (c) a data form converter which converts the first logic circuit data, the second logic circuit data and the "don't care" indicating data into third, fourth and fifth data, respectively, each having a form conforming to an equivalency test, (d) a data coupler which couples an input in the fourth data to an associated input in the fifth data, (e) an output detector which detects an output in the fourth data which output is associated with an input in response to which the fifth data outputs the predetermined logic value, and (f) an equivalency tester which deems an output detected by the output detector, as an output having an undefined value, among outputs derived from the fourth data, and which judges whether an output derived from the third data is coincident with an output derived from the second data by comparing them to each other, with respect to outputs not detected by the output detector.

There is still further provided a method of processing logic circuit data, including the steps of (a) externally reading first logic circuit data which is to be judged as to whether equivalent to reference data, and storing the thus read first logic circuit data into an internal database, (b) externally reading second logic data used as reference data in judgment of equivalency with other data, and storing the thus read second logic circuit data into the internal database, (c) externally reading "don't care" indicating data which receives the same inputs as inputs received in the second logic circuit data and which outputs a predetermined logic value in response only to an input associated with a "don't care" output, and storing the thus read "don't care" indicating data into the internal database, (d) converting the first logic circuit data into third data having a form conforming to an equivalency test, (e) converting the second logic circuit data into fourth data having a form conforming to an equivalency test, (f) converting the "don't care" indicating data into fifth data having a form conforming to an equivalency test, (g) coupling an input in the fourth data to an associated input in the fifth data, and storing the thus coupled data into the internal database, (h) detecting an output in the fourth data which output is associated with an input in response to which the fifth data outputs the predetermined logic value, and (i) deeming an output detected by the step (h), as an output having an undefined value, among outputs derived from the fourth data, and judging whether an output derived from the third data is coincident with an output derived from the second data by comparing them to each other, with respect to outputs not detected by the step (h).

There is further provided a processor including (a) an internal database storing logic circuit data therein, (b) a data reader which externally reads (b1) original logic circuit data, and (b2) "don't care" indicating data which outputs a predetermined logic value in response only to a specific input among a plurality of outputs derived from the original logic circuit data, (c) a data form converter which converts the original logic circuit data and the "don't care" indicating data into first and second data, respectively, each having a form conforming to synthesis of logic, (d) a data coupler which couples an input in the first data to an associated input in the second data, (e) an output detector which detects an output derived from the first data which output is associated with an input in response to which the second data outputs the predetermined logic value, and converts the thus detected output into an undefined output as third data, and (f) a logic synthesizer which reads the third data thereinto for logic synthesis to thereby produce resultant synthesized logic circuit data.

There is yet further provided a method of processing logic circuit data, including the steps of (a) externally reading original logic data, and storing the thus read original logic data into an internal database, (b) externally reading "don't care" indicating data which outputs a predetermined logic value in response only to a specific input among a plurality of outputs derived from the original logic circuit data, and storing the thus read "don't care" indicating data into the internal database, (c) converting the original logic circuit data into first data having a form conforming to synthesis of logic, (d) converting the "don't care" indicating data into second data having a form conforming to synthesis of logic, (e) coupling an input in the first data to an associated input in the second data, (f) detecting an output derived from the first data which output is associated with an input in response to which the second data outputs the predetermined logic value, and converting the thus detected output into an undefined output as third data, and (g) synthesizing logic in accordance with the third data to thereby produce resultant synthesized logic circuit data.

In yet another aspect of the present invention, there is provided a recording medium readable by a computer, storing a program therein for causing a computer to carry out the above-mentioned method of designating an output "don't care".

There is further provided a recording medium readable by a computer, storing a program therein for causing a computer to carry out the above-mentioned method of processing logic circuit data.

There is still further provided a recording medium readable by a computer, storing a program therein for causing a computer to act as the above-mentioned apparatus for designating an output "don't care".

There is yet further provided a recording medium readable by a computer, storing a program therein for causing a computer to act as the above-mentioned processor.

The advantages obtained by the aforementioned present invention will be described hereinbelow.

In accordance with the above-mentioned method of designating "don't care", it is possible to designate an output of logic circuit data which output is associated with an input in response to which "don't care" output data outputs a predetermined logical value, as an output status of an output "don't care", by determining the predetermined logical value as an output value in desired output status. As a result, it would be possible to more readily designate "don't care" logic than the conventional methods.

In the method and apparatus for carrying out an equivalency test in accordance with the present invention, a "don't care" node and "don't care" logic may be designated to one of two logic circuit data to be tested, resulting in significant reduction in steps to be carried out relative to the conventional methods.

In addition, in accordance with the present invention, an equivalency test can be carried out to a circuit comprised of a plurality of circuits combined to one another, resulting in that it would be possible to more readily analyze the reason of non-equivalency and identify a non-equivalent part in tested circuits than the conventional methods, even if an equivalency test shows that tested circuits are not equivalent to each other.

The apparatus and method of synthesizing logic in accordance with the present invention makes it possible to produce a plurality of functional circuits having the same logic, from single original logic circuit data, resulting in enhancement in design efficiency and reduction in design errors.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 14A, 14B and 14C illustrate an example of producing data used for logic synthesis to be carried out by an apparatus for synthesizing logic, in accordance with the present invention.

DESCRIPTION OF THE PREFERRED EMBODIMENTS

Preferred embodiments in accordance with the present invention will be explained hereinbelow with reference to drawings.

Figure 1:
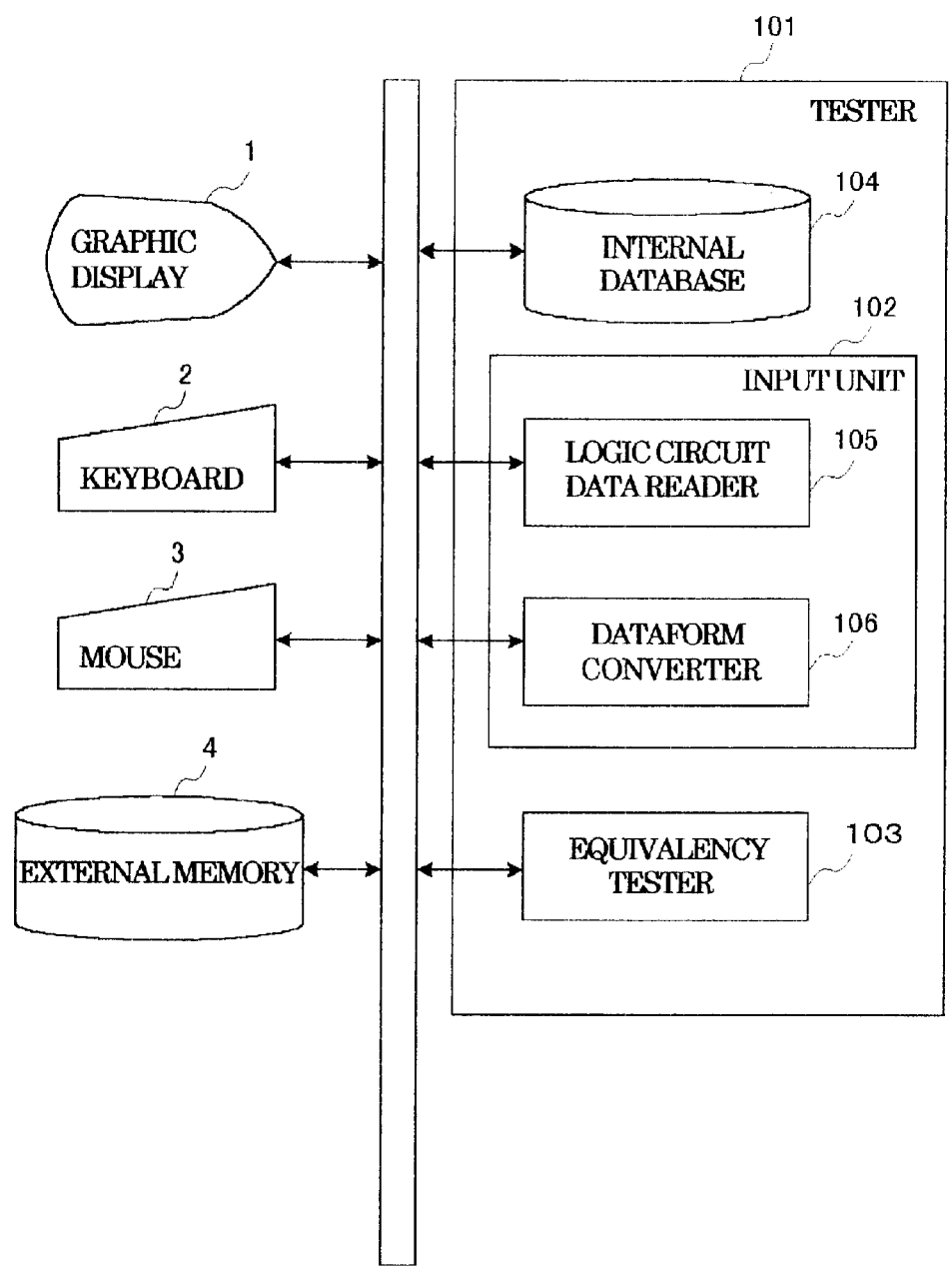
FIG. 1 is a block diagram of a conventional system for carrying out an equivalency test.
Figure 2:
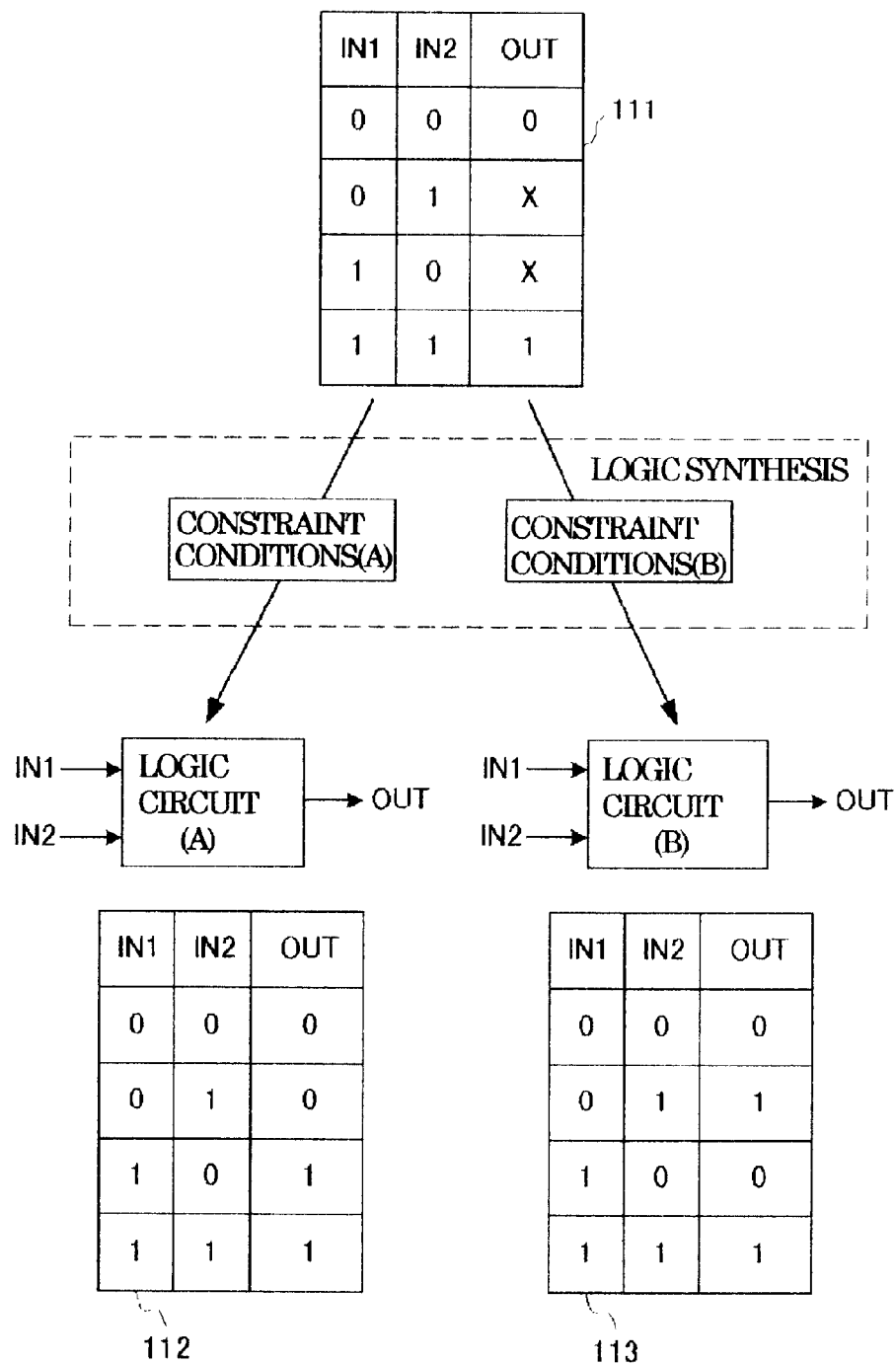
FIG. 2 illustrates an example of synthesis of logics derived from logic circuit data including "don't care" logic.
Figure 3:
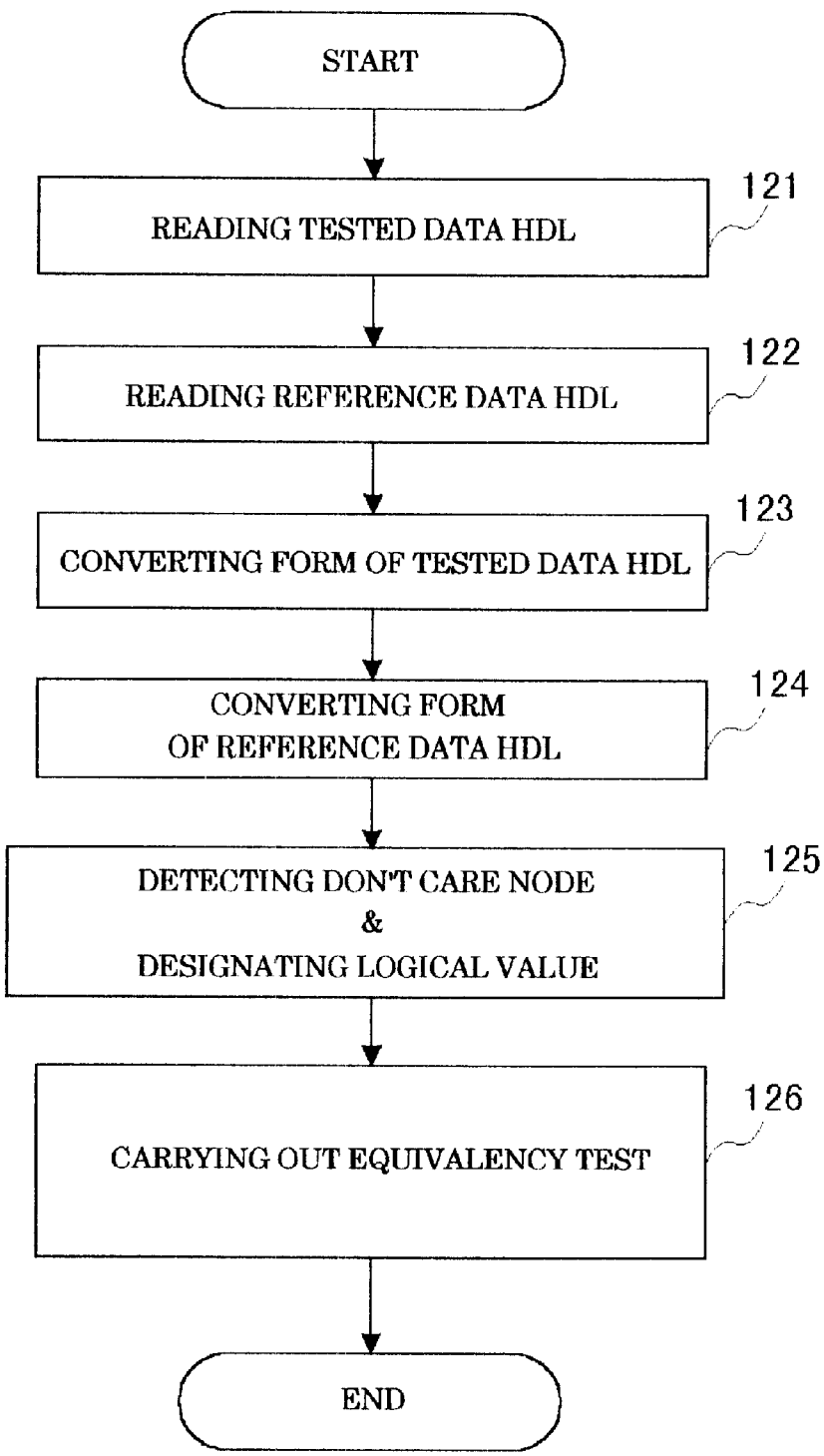
FIG. 3 is a flow chart of a first conventional method of carrying out an equivalency test which method prevents inconsistency in logics, caused y "don't care" logic.
Figure 4A:
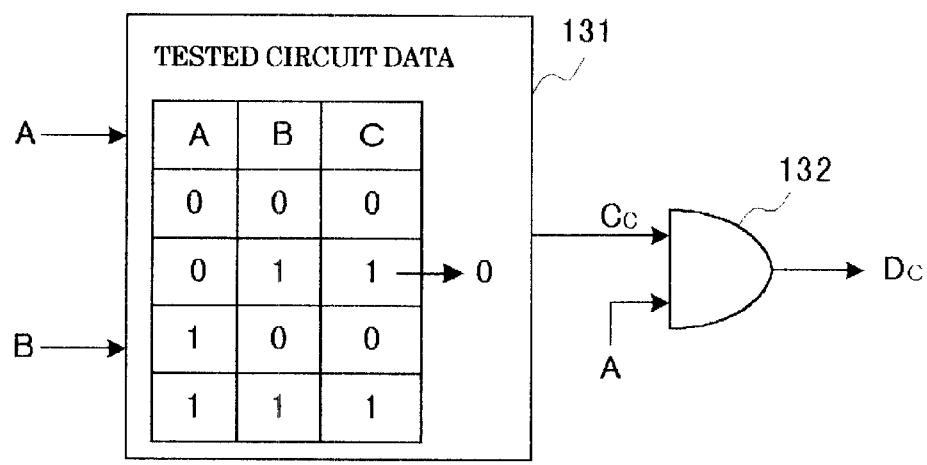
FIGS. 4A and 4B illustrate examples of prevention of inconsistency in logics in the first conventional method.
Figure 4B:
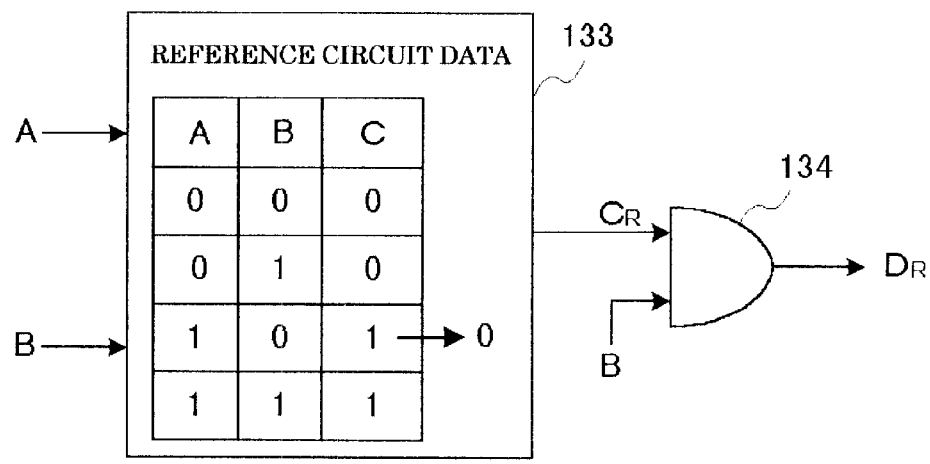
Figure 5:
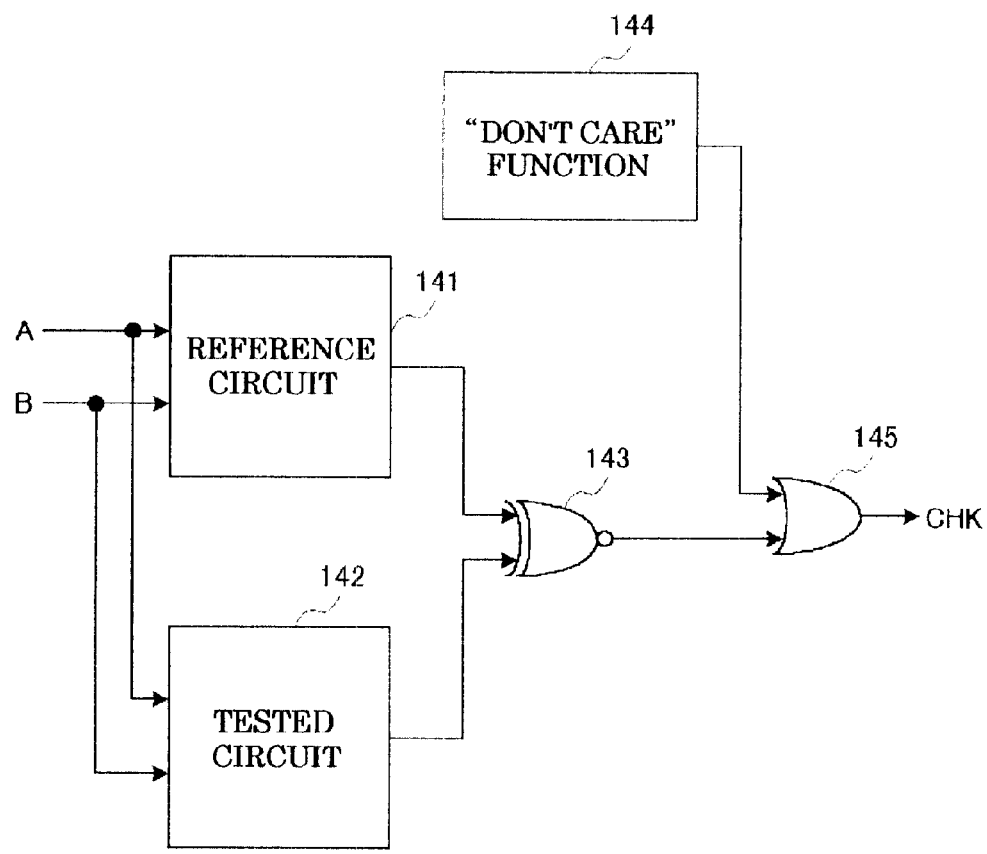
FIG. 5 is a block diagram of a second conventional apparatus of carrying out an equivalency test.
Figure 6:
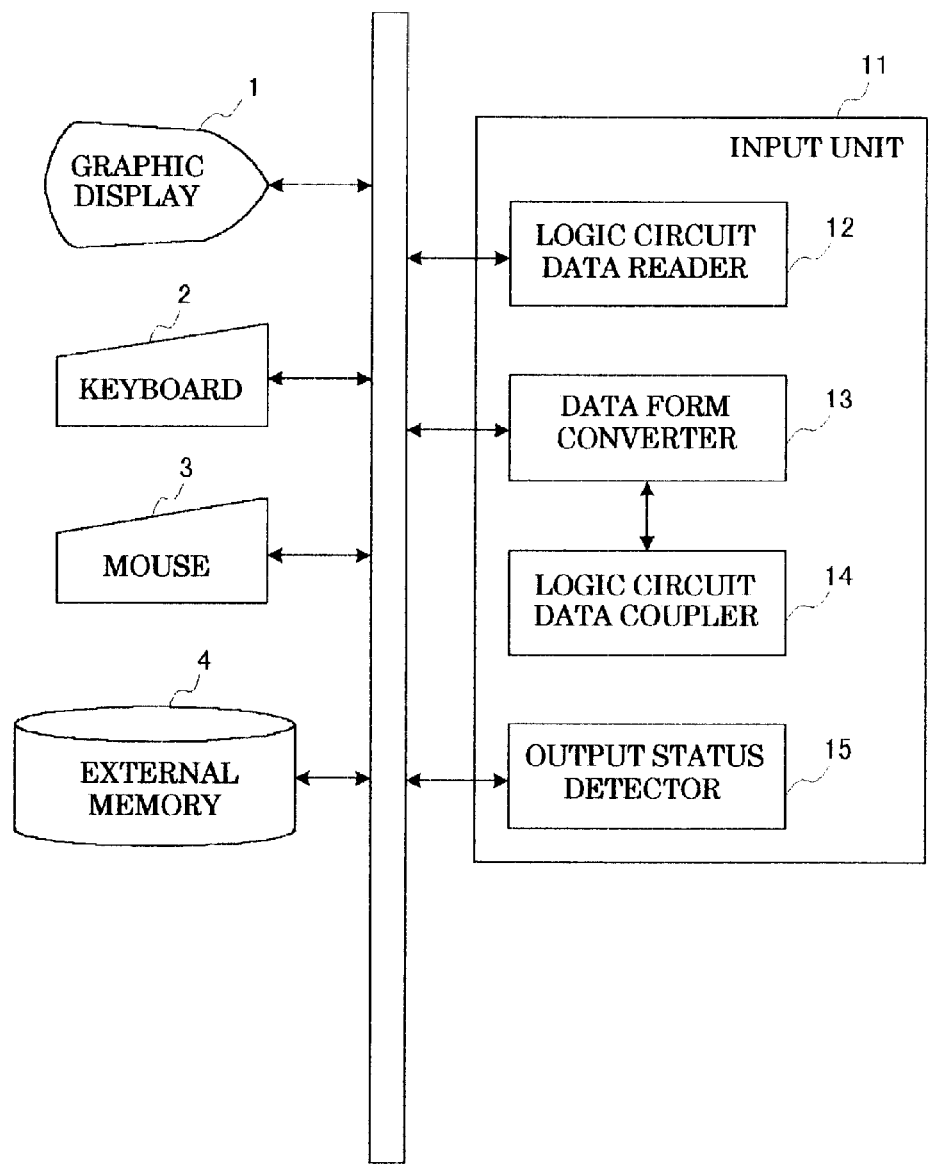
FIG. 6 is a block diagram of a system for designating an output "don't care" in accordance with an embodiment of the present invention.

FIG. 6 is a block diagram of a system for designating an output "don't care", in accordance with the first embodiment of the present invention.

The illustrated system is comprised of a graphic display 1, a keyboard 2, a mouse 3, an external memory 4, and an apparatus 11 for designating "don't care". The apparatus 11 is comprised of a logic circuit data reader 12, a data form converter 13, a logic circuit data coupler 14, and an output status detector 15.

The external memory 4 receives logic circuit data designated as an output "don't care" and "don't care" indicating data from outside of the system, and stores the thus received data therein. The "don't care" indicating data outputs a predetermined logical value, for instance, "1" in response only to a specific input associated with an output of the logic circuit data which output is designated as an output "don't care" and defined by a combination of a plurality of inputs. The logic circuit data may be designed to be in the form of HDL, logic formula, a table of truth value, or data about gate-leveled connection.

Figure 7:
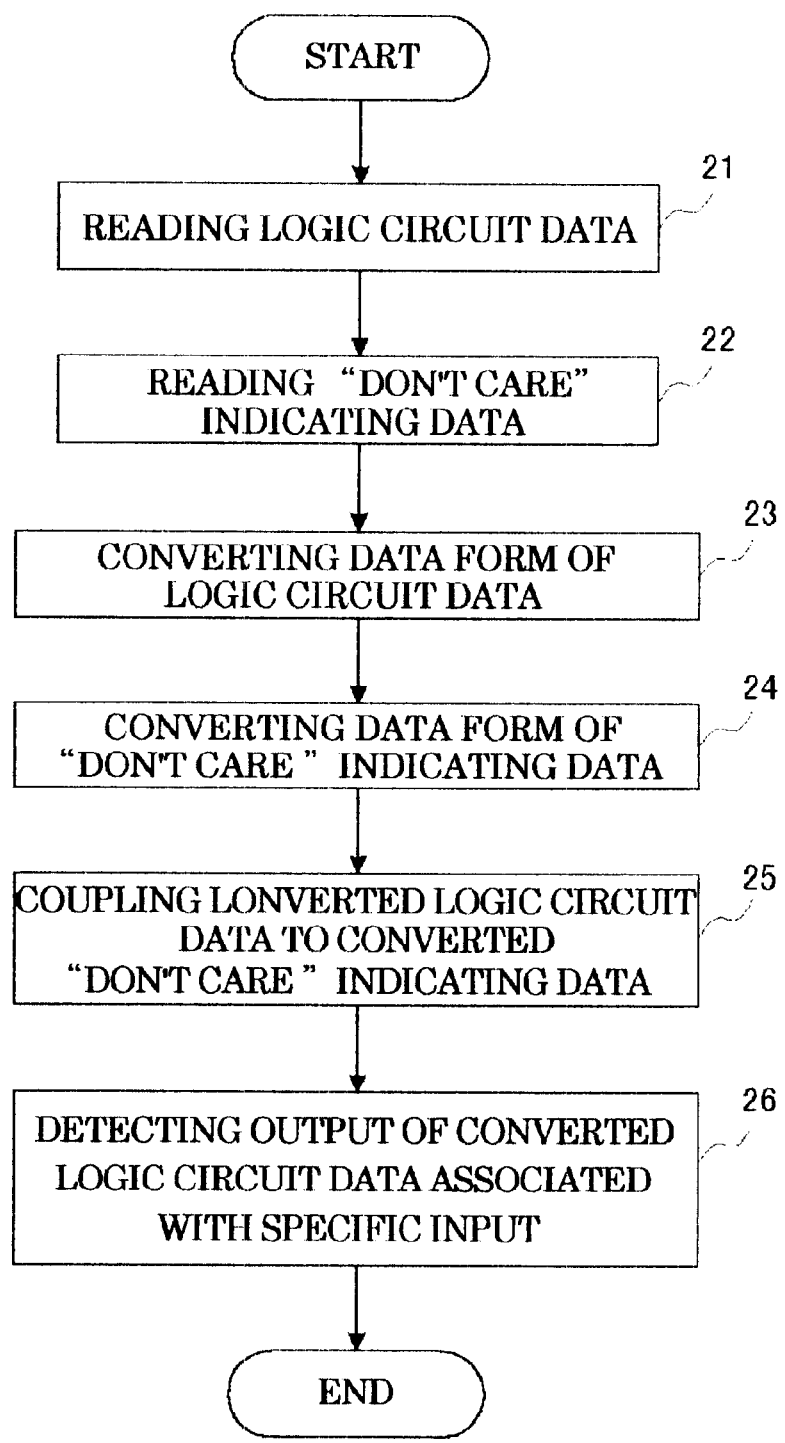
FIG. 7 is a flow chart of an operation of the system illustrated in FIG. 6.
Figure 8:
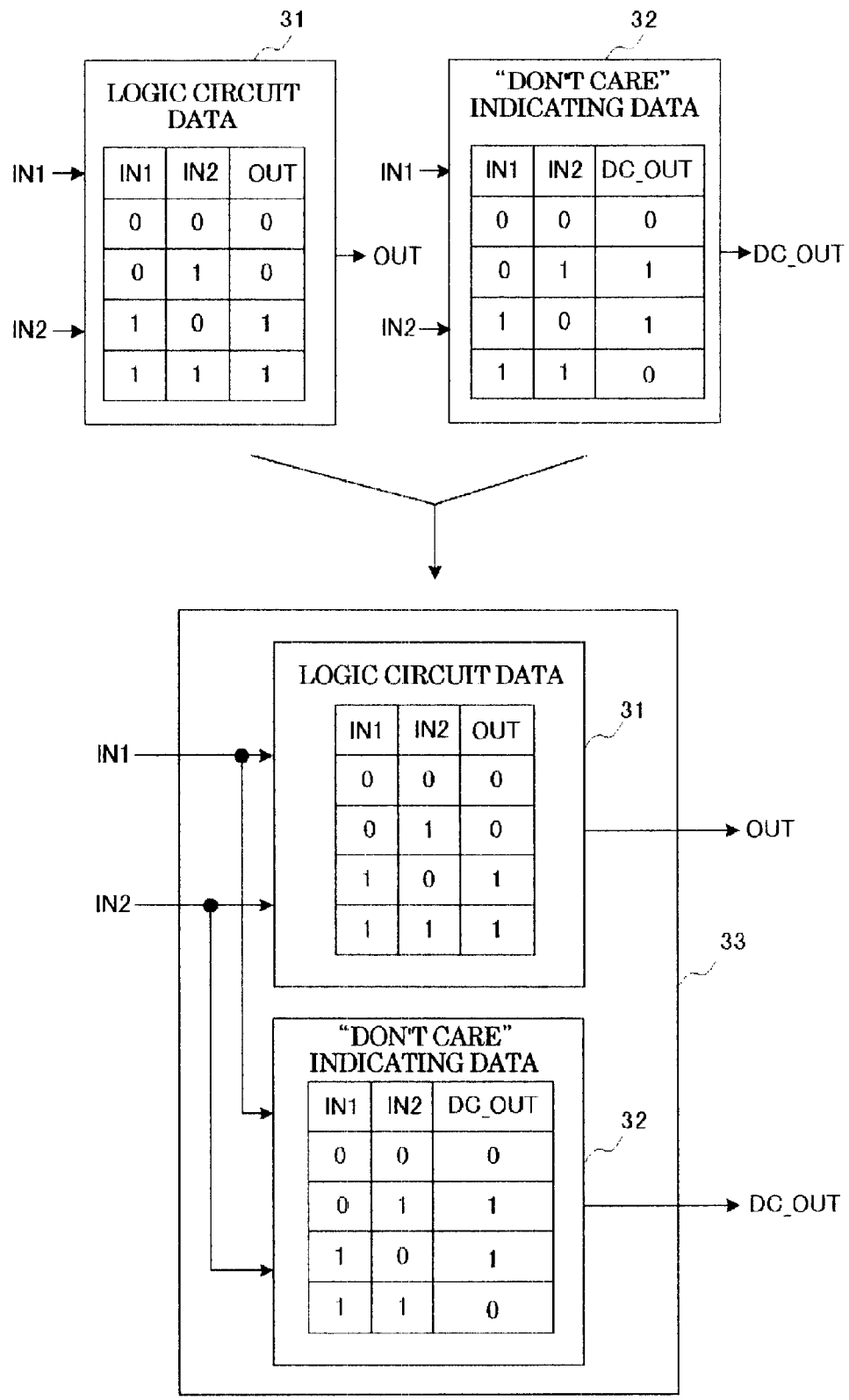
FIG. 8 illustrates coupling of logic circuit data and "don't care" indicating data.

FIG. 7 is a flow chart of steps in the method of designating an output "don't care", FIG. 8 illustrates logic circuit data and "don't care" indicating data which are to be coupled to each other.

Hereinbelow are explained steps in the method of designating an output "don't care" with reference to FIGS. 6, 7 and 8.

With reference to FIG. 7, the logic circuit data reader 12 reads logic circuit data 31 out of the external memory 4, in step 21.

Then, the logic circuit data reader 12 reads "don't care" indicating data 32 out of the external memory 4, in step 22.

Then, the data form converter 13 converts the logic circuit data 31 into data having a form conforming to an application, in step 23. The thus converted data is referred to as converted logic circuit data.

In the same way, the data form converter 13 converts the "don't care" indicating data 32 into data having a form conforming to an application, in step 24. The thus converted data is referred to as converted "don't care" indicating data.

If it is not necessary for the logic circuit data 31 and the "don't care" indicating data 32 to be converted into data having a form conforming to an application, steps 23 and 24 are omitted.

Then, the logic circuit data coupler 14 couples each of a plurality of inputs in the converted logic circuit data to an associated input in the converted "don't care" indicating data, in step 25. The thus produced data by coupling the above-mentioned data to each other is referred to as coupled logic circuit data 33.

FIG. 8 illustrates the coupled logic circuit data 33. With reference to FIG. 8, in order to correspond an output OUT of the logic circuit data 31 to an output of the associated "don't care" indicating data 32, an output node of the "don't care" indicating data 32 is named "DC_OUT" by adding a suffix "DC_" to a name "OUT" of an output node of the coupled logic circuit data 33. In place of addition of a suffix, an output node may be designed to have a flag indicative of correspondence between nodes.

It should be noted that steps 23 and 24 are omitted in FIG. 8 for simplification.

Then, in step 26, the output status detector 15 detects an output of the converted logic circuit data which output is associated with an input in response to which the converted "don't care" indicating data outputs a logical value "1".

Hereinbelow is explained step 26 in detail with reference to FIG. 8. In the coupled logic circuit data 33, the output node of the "don't care" indicating data 32 transmits a predetermined logical value "1" as the output "DC_OUT", when inputs are as follows: (IN1, IN2)=(0, 1) or (IN1, IN2)=(1, 0) In step 26, there is detected an output by which a node designating an output OUT transmitted from an output node of the logic circuit data 31 at the above-identified inputs (IN1, IN2) transmits an output "don't care", as "don't care" logic of a "don't care" node.

As having been explained so far, the method illustrated in FIG. 7 makes it possible to designate an output of the logic circuit data which output is associated an input in response to which the "don't care" indicating data 32 transmits a logical value "1", as an output status of an output "don't care", by setting a desired output status to be equal to a logical value "1" through the "don't care" indicating data 32.

Hereinbelow are explained an apparatus and a method of carrying out an equivalency test to logic circuit data including "don't care" logic, making use of the above-mentioned apparatus and method of designating "don't care".

Figure 9:
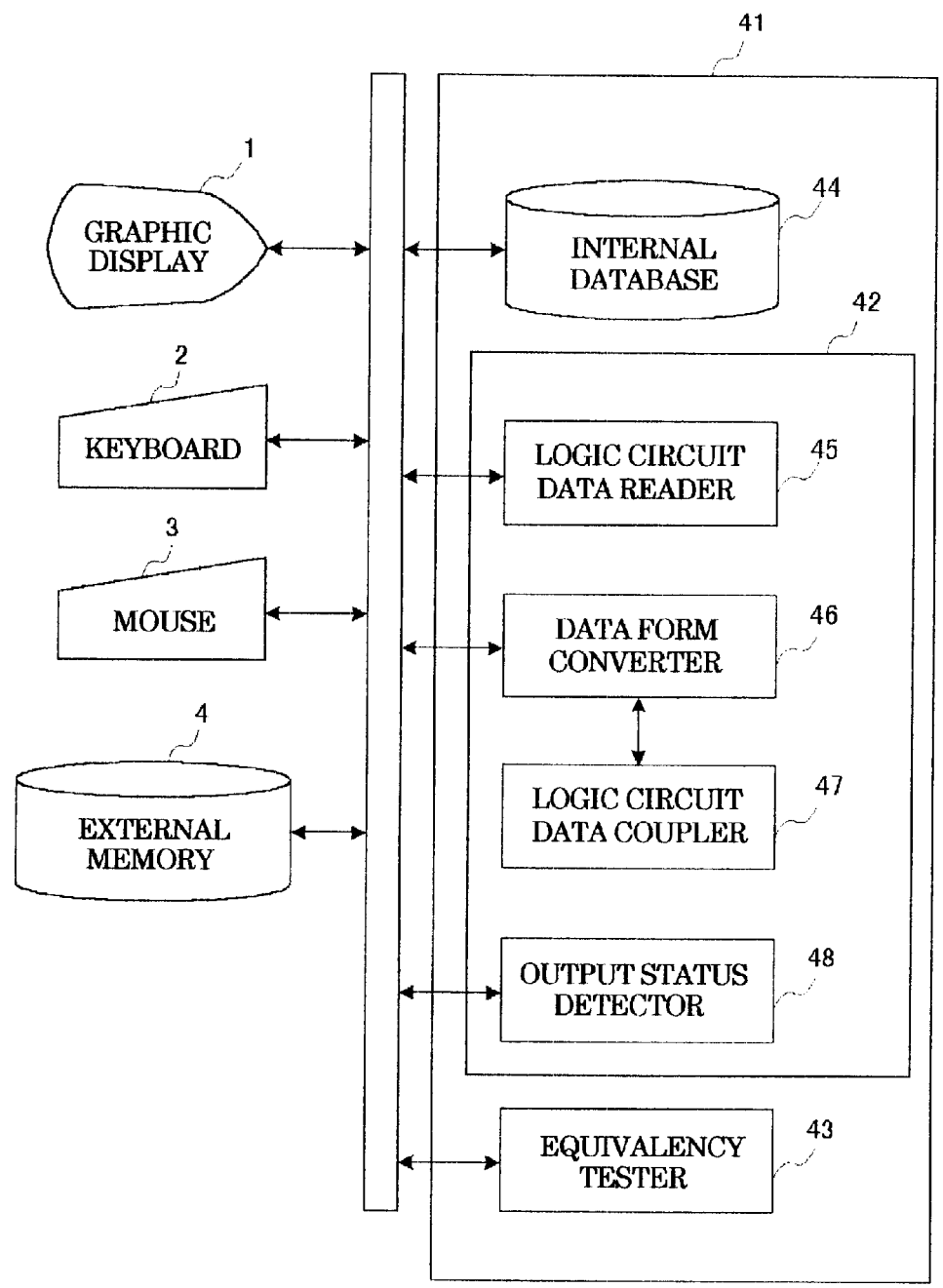
FIG. 9 is a block diagram of a system for carrying out an equivalency test in accordance with an embodiment of the present invention.

FIG. 9 is a block diagram of a system for carrying out an equivalency test, in accordance with the second embodiment of the present invention.

The illustrated system is comprised of a graphic display 1, a keyboard 2, a mouse 3, an external memory 4, and an apparatus 41 for carrying out an equivalency test. The apparatus 41 is comprised of a "don't care" designator 42, an equivalency tester 43, and an internal database 44. The "don't care" designator 42 is comprised of a logic circuit data reader 45, a data form converter 46, a logic circuit data coupler 47, and an output status detector 15.

The external memory 4 receives tested logic circuit data which will be subject to an equivalency test, reference logic data used as reference data in an equivalency test, and "don't care" indicating data, and stores the thus received data therein. The "don't care" indicating data receives the same inputs as those of the reference logic circuit data, and outputs a predetermined logical value in response only to a specific input associated with an output of the logic circuit data, designated as an output "don't care".

It is assumed hereinbelow that the tested logic circuit data, the reference logic circuit data and the "don't care" indicating data are all described in HDL, and are called reference data HDL, tested data HDL, and "don't care" data HDL, respectively.

Figure 10:
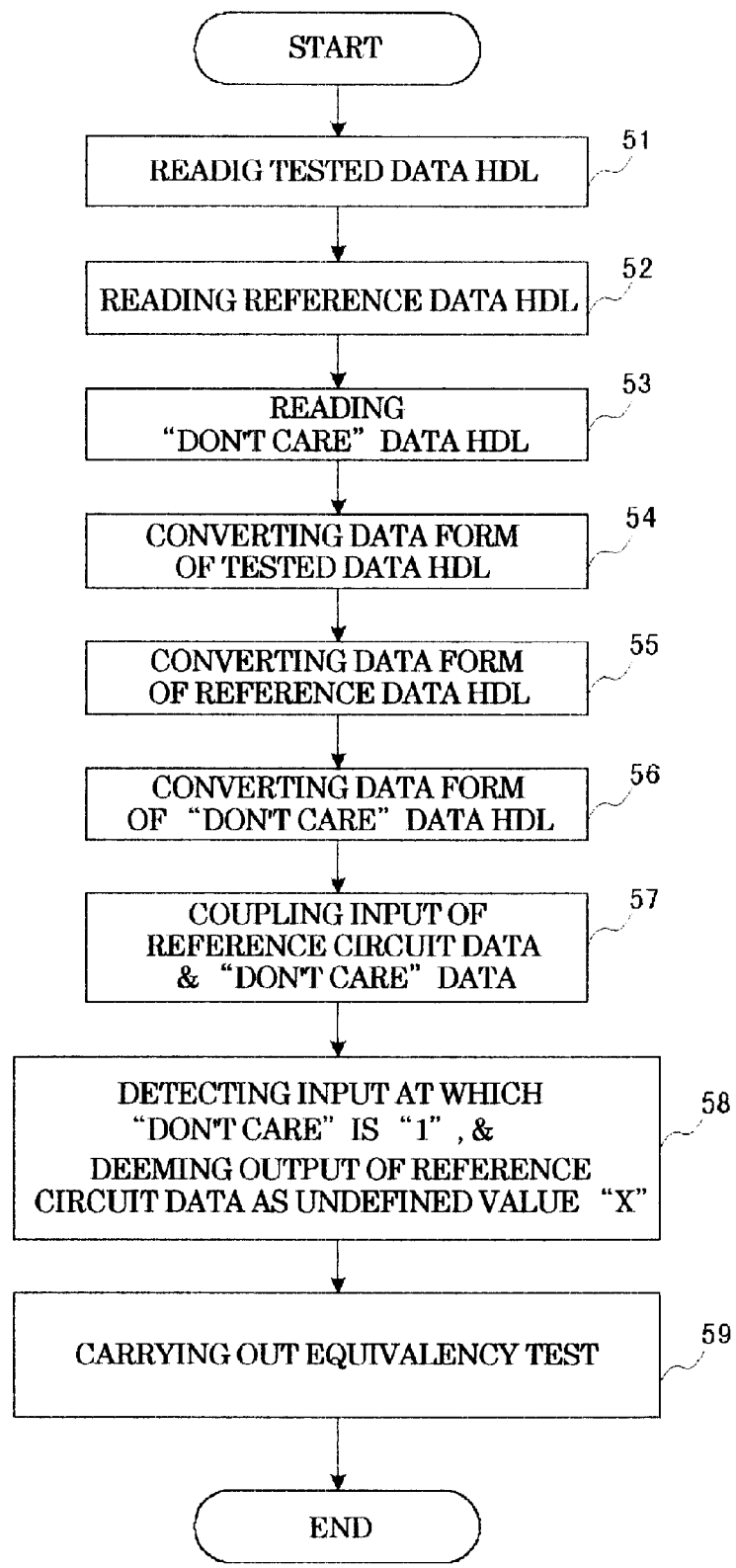
FIG. 10 is a flow chart of an operation of the system illustrated in FIG. 9.
Figure 11:
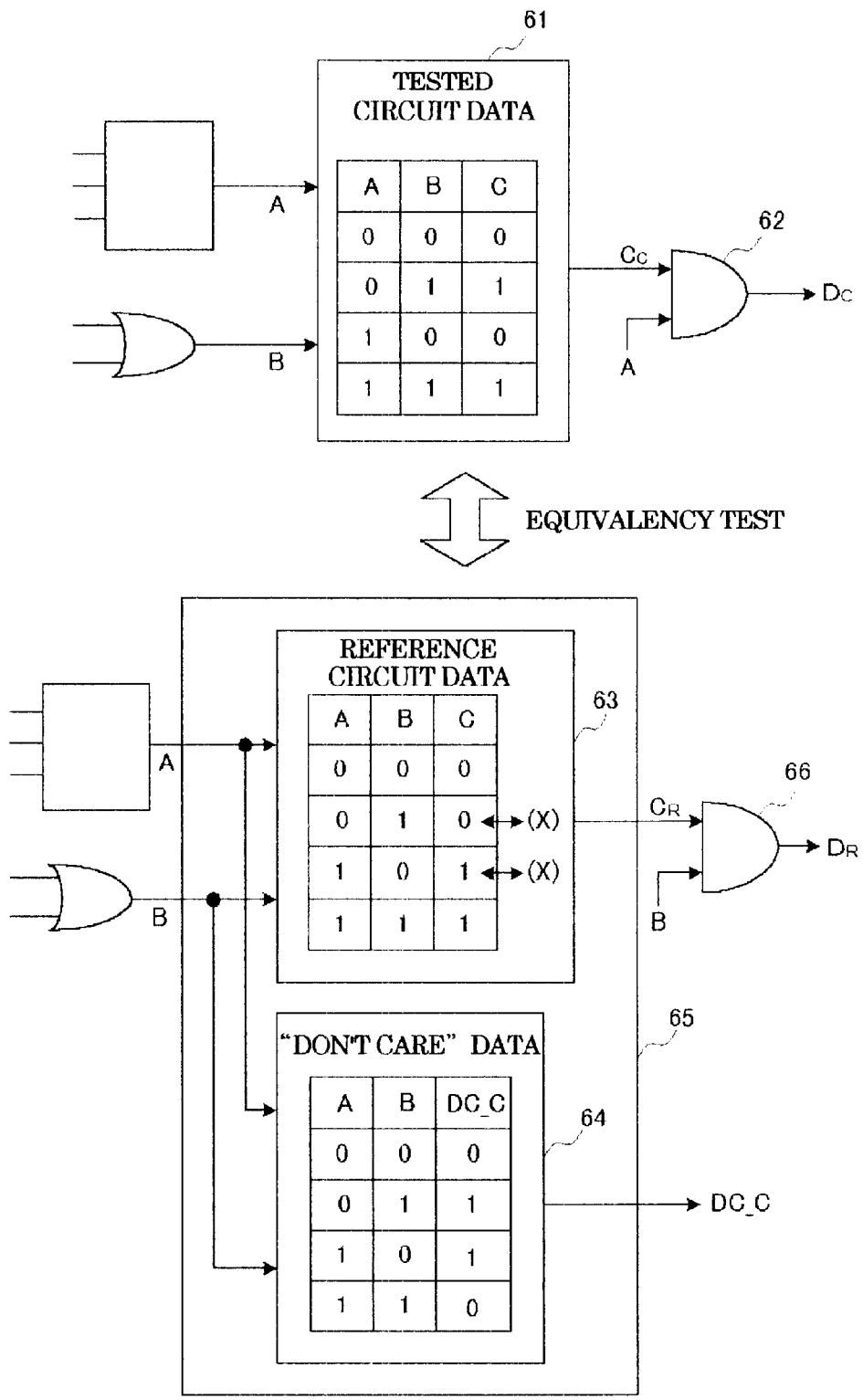
FIG. 11 illustrates an equivalency test carried out by the system illustrated in FIG. 9.

FIG. 10 is a flow chart showing an operation of the apparatus 41, FIG. 11 illustrates an equivalency test to be carried out by the apparatus 41.

Hereinbelow are explained steps in FIG. 10.

With reference to FIG. 10, the logic circuit data reader 45 reads the tested data HDL out of the external memory 4, and stores the thus read-out tested data HDL in the internal database 44, in step 51. If there is a technology library which will be necessary in a later mentioned step 54, the logic circuit data reader 45 reads the technology library, and stores in the internal database 44.

Then, the logic circuit data reader 45 reads the reference data HDL out of the external memory 4, and stores the thus read-out reference data HDL in the internal database 44, in step 52. If there is a technology library which will be necessary in a later mentioned step 55, the logic circuit data reader 45 reads the technology library, and stores in the internal database 44.

Then, the logic circuit data reader 45 reads the "don't care" data HDL out of the external memory 4, and stores the thus read-out "don't care" data HDL in the internal database 44, in step 53. If there is a technology library which will be necessary in a later mentioned step 56, the logic circuit data reader 45 reads the technology library, and stores in the internal database 44.

Then, the data form converter 46 converts the tested data HDL into tested circuit data 61 having a form conforming to an equivalency test, in step 54.

In the same way, the data form converter 46 converts the reference data HDL into reference circuit data 63 having a form conforming to an equivalency test, in step 55.

Further, the data form converter 46 converts the "don't care" data HDL into "don't care" data 64 having a form conforming to an equivalency test, in step 56.

Then, the logic circuit data coupler 47 couples an input in the reference circuit data 63 to an associated input in the "don't care" data 64 to thereby produce coupled reference circuit data 65, in step 57. The thus produced coupled reference circuit data 65 is stored in the internal database 44. In order to correspond an output C transmitted from the reference circuit data 63 to an output transmitted from the associated "don't care" data 64, an output node of the "don't care" data 64 is named "DC_C" by adding a suffix "DC_" to a name "C" of an output node of the reference circuit data 63. This naming is the same as the naming in FIG. 8.

Then, the output status detector 48 detects an output transmitted from the reference circuit data associated with an input in response to which the "don't care" data outputs a logical value "1", in step 58. The thus detected output transmitted from the reference circuit data is deemed an undefined value "X" in an equivalency test.

In step 59, the equivalency tester 43 carries out an equivalency test. Since the output detected by the output status detector 48 in step 58 among outputs transmitted from the reference circuit data 63 is deemed an undefined value "X", the equivalency tester 43 judges that an output transmitted from the tested circuit data 61 is equivalent to an output transmitted from the reference circuit data 63, regardless of an output transmitted from the tested circuit data 61. Further, the equivalency tester 43 judges whether an output transmitted from the tested circuit data 61 is equivalent to outputs transmitted from the reference circuit data 63 and not detected by output status detector 48 in step 58, and transmits results of the equivalency test to the graphic display 1 and/or external memory 4.

As mentioned above, the output transmitted from the reference circuit data and designated by the "don't care" data is deemed the undefined value "X" in an equivalency test. When an output is introduced into a next stage circuit as input, an original output is to be introduced into the next stage circuit. This is explained hereinbelow with reference to FIG. 11.

With reference to FIG. 11, the tested circuit data 61 and the reference circuit data 63 transmit different outputs when inputs (A, B) are (0, 1) and (1, 0). Hence, in order for the equivalency tester 43 to judge that outputs transmitted from the tested circuit data 61 and the reference circuit data 63 are equivalent to each other, the outputs associated with the inputs (A, B) being (0, 1) and (1, 0) are designated as a logical value "1" by the "don't care" data 64.

As a result, in an equivalency test in which an output node $C_C$ transmitted from the tested circuit data 61 and an output node $C_R$ transmitted from the reference circuit data 63 are judged whether equivalent to each other, the outputs transmitted from the reference circuit data 63 in association with the inputs (A, B) being (0, 1) and (1, 0) are deemed an undefined value "X". Hence, the tested circuit data 61 and the reference circuit data 63 are judged equivalent to each other.

In an equivalency test in which an output node $D_C$ of an AND circuit 62 arranged at a next stage of the tested circuit data 61 and an output node $D_R$ of an AND circuit 66 arranged at a next stage of the reference circuit data 63 are judged whether equivalent to each other, the original outputs transmitted from the output node $C_R$ of the reference circuit data 63 in response to the inputs (A, B) being (0, 1) and (1, 0), that is, the outputs transmitted from the output node $D_R$ when a logical value "0" is input into the AND circuit 66 in response to the inputs (A, B) being (0, 1) and when a logical value "1" is input into the AND circuit 66 in response to the inputs (A, B) being (1, 0), are compared to an output transmitted from the output node $D_C$ transmitted from the AND circuit 62. Hence, it is judged that an output transmitted from the output node $D_R$ and an output transmitted from the output node $D_C$ are equivalent to each other.

The equivalency test in the second embodiment can be carried out to a circuit comprised of a plurality of circuits combined to one another, without the problems caused in the above-mentioned conventional method suggested in Japanese Unexamined Patent Publication No. 11-3361. Hence, even if non-equivalency is found in the equivalency test, it would be possible to analyze the reason of non-equivalency, and identify a portion causing non-equivalency more readily than the conventional methods.

In the second embodiment, the "don't care" data HDL is added to the reference data HDL. It should be noted that the "don't care" data HDL may be added to the tested data HDL, or the "don't care" data HDL may be added to both the reference data HDL and the tested data HDL.

The equivalency tester 43 may be designed to include the output status detector 48 so as to judge whether the reference circuit data outputs an output node in response to "don't care" data which has been renamed in the equivalency test. If an associated "don't care" node exists, the equivalency tester 43 monitors outputs transmitted from an output node in the "don't care" data, and, if the monitored output is a logical value "1", an output transmitted from the associated node in the reference circuit data is deemed an undefined value "X". Then, the equivalency tester 43 carries out an equivalency test.

In the third embodiment, there are provided an apparatus and a system for synthesizing logic both of which are based on the above-mentioned apparatus and method of designating an output "don't care". The apparatus and system in accordance with the third embodiment make it possible to synthesize a plurality of logic circuits having partially different specifications from one another, based on one original logic circuit data.

Figure 12:
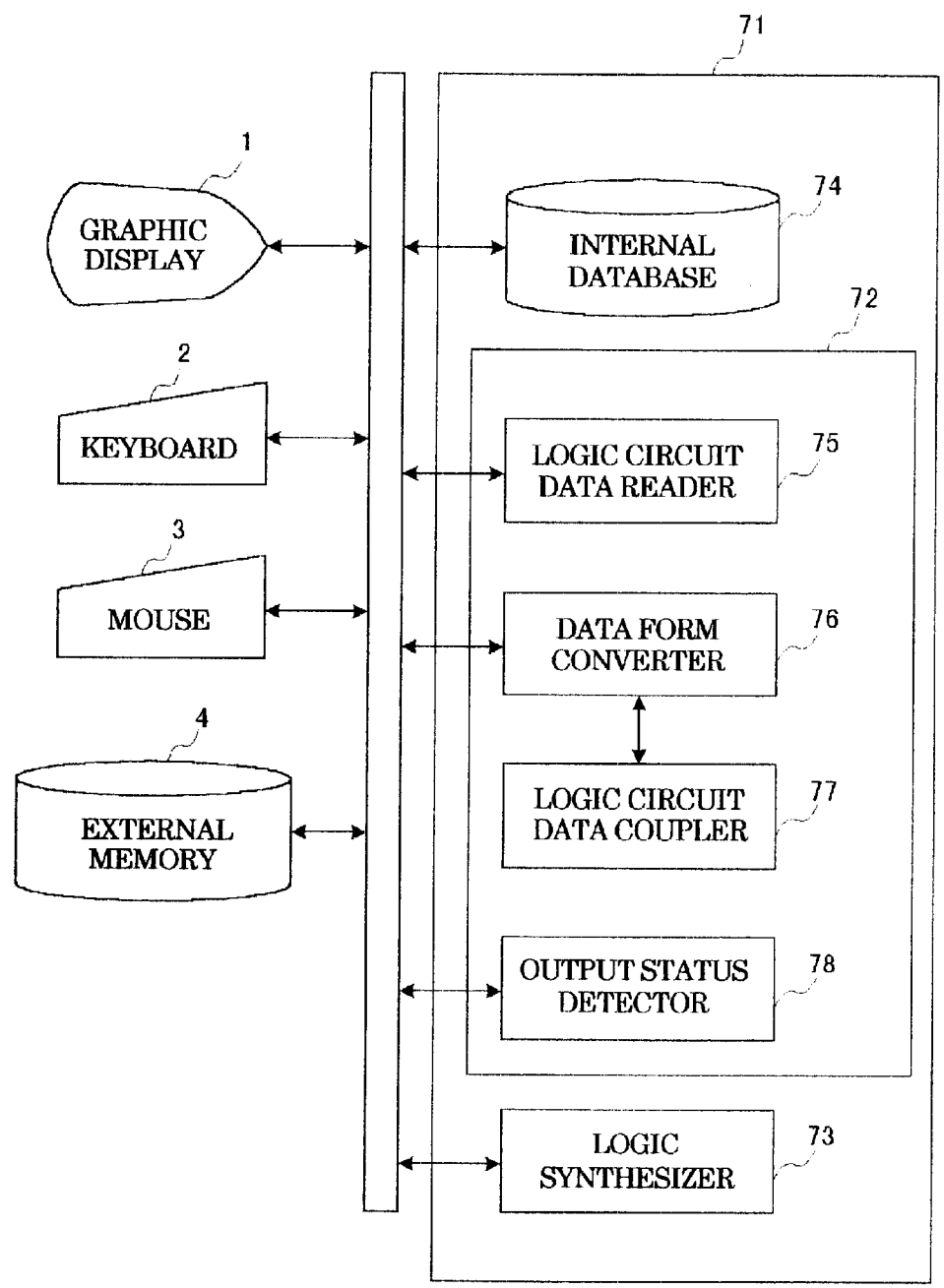
FIG. 12 is a block diagram of a system for synthesizing logics in accordance with an embodiment of the present invention.

FIG. 12 is a block diagram of a system for synthesizing logic, in accordance with the third embodiment.

The system is comprised of a graphic display 1, a keyboard 2, a mouse 3, an external memory 4, and a unit 71 for synthesizing logic. The unit 71 is comprised of a unit 72 for designating an output "don't care", a logic synthesizer 73, and an internal database 74. The unit 72 is comprised of a logic circuit data reader 75, a data form converter 76, a logic circuit data coupler 77, and an output status detector 78.

The external memory 4 receives original logic circuit data including logic circuit data which may be separated therefrom, and "don't care" indicating data receiving the same inputs as the inputs received by the original logic circuit data and outputting a predetermined logical value in response only to an input associated with a "don't care" output, and stores the thus received data therein.

The original logic circuit data and the "don't care" indicating data are expressed in HDL, and hence, are called original circuit HDL and "don't care" data HDL, respectively.

Figure 13:
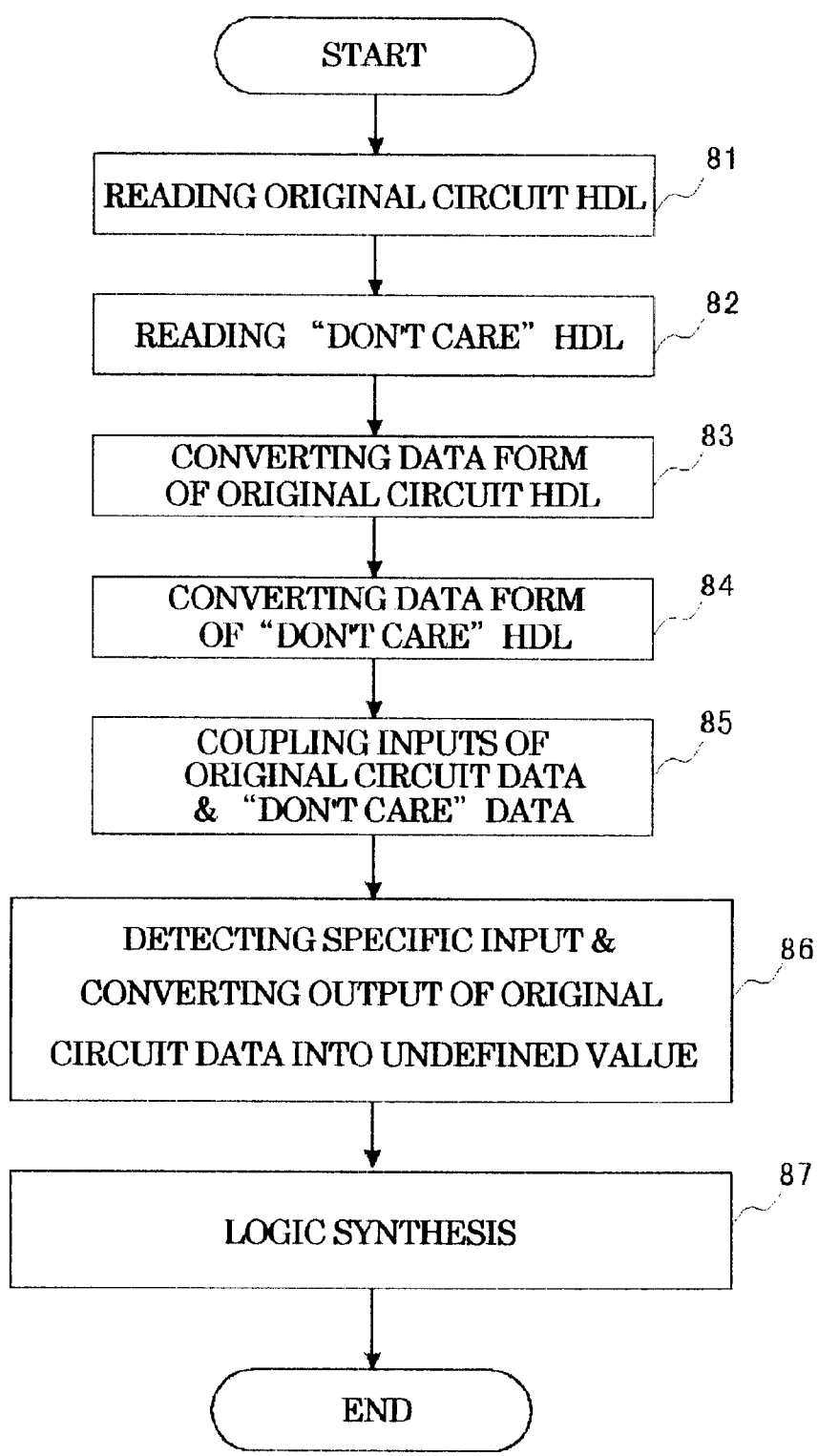
FIG. 13 is a flow chart of an operation of the system illustrated in FIG. 12.

FIG. 13 is a flow chart of an operation of the logic synthesizing unit 71, and FIGS. 14A, 14B and 14C illustrate examples of data used for logic synthesis by the logic synthesizing unit 71.

With reference to FIG. 13, the logic data reader 75 reads the original circuit HDL 91 out of the external memory 4, and stores the thus read-out original circuit HDL 91 in the internal database 74, in step 81.

As illustrated in FIG. 14A, functions are described in the original circuit HDL 91 such that when signal 1 is in the status of "AA", an operation "a=b+c" is carried out, when signal 1 is in the status of "BB", an operation "a=b×c" is carried out, when signal 1 is in the status of "CC", an operation "a=b/c" is carried out, when signal 1 is in the status of "DD", an operation "a=b % c" is carried out, and when signal 1 is in default, "a" is kept equal to "x".

Then, the logic data reader 75 reads the "don't care" data HDL 92 out of the external memory 4, and stores the thus read-out "don't care" data HDL 92 in the internal database 74, in step 82.

As illustrated in FIG. 14B, functions are described in the "don't care" data HDL 92 such when signal 1 is in the status of "DD", "a" is kept equal to 1, and when signal 1 is in default, "a" is kept equal to 0.

Then, the data form converter 76 converts the original data HDL 91 into original circuit data having a form conforming to logic synthesis, and stores the thus produced original circuit data in the internal database 74, in step 83.

Then, the data form converter 76 converts the "don't care" data HDL 92 into "don't care" data having a form conforming to logic synthesis, and stores the thus produced "don't care" data in the internal database 74, in step 84.

Then, the logic circuit data coupler 77 couples an input in the original circuit data to an associated data in the "don't care" data, in step 85.

Then, in step 86, the output status detector 78 detects an output in the original circuit data which output is associated with an input in response to which the "don't care" data outputs a predetermined logical value, and converts the thus detected output into an undefined value "X" to thereby produce circuit data used for logic synthesis. The thus produced circuit data is stored in the internal database 74.

The thus produced circuit data corresponds to logic synthesis HDL 93 illustrated in FIG. 14C, in which functions are described such that when signal 1 is in the status of "AA", an operation "a=b+c" is carried out, when signal 1 is in the status of "BB", an operation "a=b×c" is carried out, when signal 1 is in the status of "CC", an operation "a=b/c" is carried out, when signal 1 is in the status of "DD", "a" is kept equal to "x", and when signal 1 is in default, "a" is kept equal to "x". In comparison with the "don't care" data HDL 92 in which when signal 1 is in the status of "DD", "a" is kept equal to "1", "1" is changed into an undefined value "X" in the logic synthesis HDL 93, because the function of "a=1" would be unnecessary in a synthesized circuit.

Though the case has been explained above where the function of carrying out "a=b % c" associated with the input status of "DD", that is, the function of calculating a residue generated when "b" is divided by "c" (b/c), is unnecessary, if other function or functions are unnecessary, it or they may be designated with the "don't care" data HDL.

Then, logic synthesis is carried out, based on the circuit data, in step 87, to thereby produce synthesized circuit data such as gate-leveled net list. The thus produced synthesized circuit data is transmitted to the graphic display 1 and/or the external memory 4.

In accordance with the third embodiment, logic synthesis is carried out with the function of carrying out "a=b % c" associated with the input status of "DD" being deemed unnecessary, ensuring compact synthesis results in comparison with results of logic synthesis with all of the functions being involved.

In the third embodiment, a plurality of functional circuits having almost the same logic is produced as single original circuit HDL, and then, unnecessary function or functions is (are) "don't care" designated. As a result, it is possible to logically synthesize a lot of kinds of functional circuits in which a different function or different functions is (are) deleted from the original circuit HDL. This ensures enhancement in designing logic circuit and reduction of errors in designing logic circuit.

The above-mentioned system for designating an output "don't care", carrying out an equivalency test, and carrying out logic synthesis may be accomplished as a program including various commands, and be presented through a recording medium readable by a computer.

Figure 15:
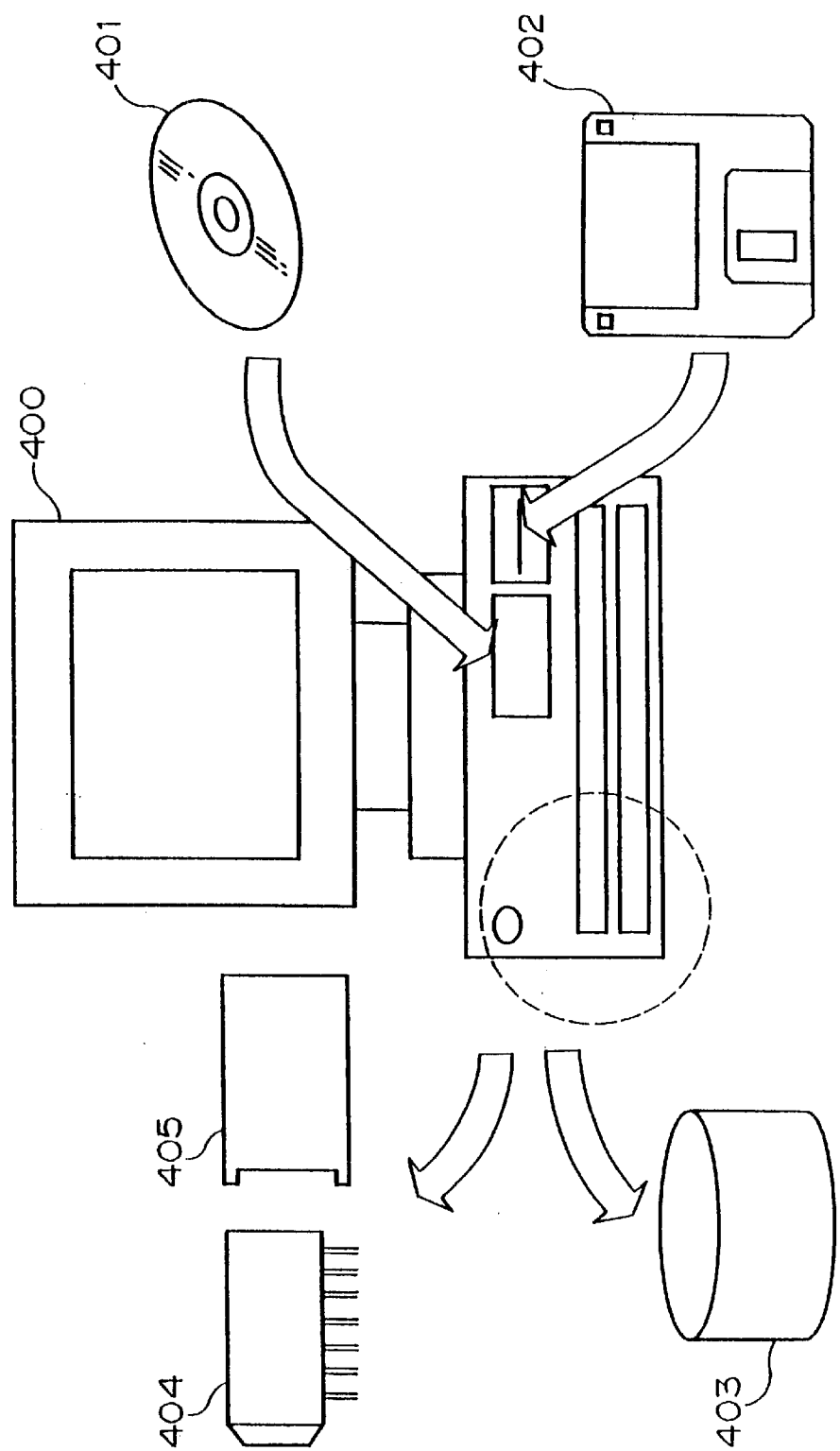
FIG. 15 illustrates examples of recording mediums in which a program for carrying out an equivalency test is to be stored.

In the specification, the term "recording medium" means any medium which can record data therein. Examples of a recording medium are illustrated in FIG. 15.

The term "recording medium" includes, for instance, a disk-shaped recorder 401 such as CD-ROM (Compact Disk-ROM) or PD, a magnetic tape, MO (Magneto Optical Disk), DVD-ROM (Digital Video Disk-Read Only Memory), DVD-RAM (Digital Video Disk-Random Access Memory), a floppy disk 402, a memory chip 404 such as RAM (Random Access Memory) or ROM (Read Only Memory), EPROM (Erasable Programmable Read Only Memory), EEPROM (Electrically Erasable Programmable Read Only Memory), smart media (Registered Trade Mark), a flush memory, a rewritable card-type ROM 405 such as a compact flush card, a hard disk 403, and any other suitable means for storing a program therein.

A recording medium storing a program for accomplishing the above-mentioned system may be accomplished by programming functions of the above-mentioned system with a programming language readable by a computer, and recording the program in a recording medium such as mentioned above.

A hard disc equipped in a server may be employed as a recording medium. It is also possible to accomplish the recording medium in accordance with the present invention by storing the above-mentioned computer program in such a recording medium as mentioned above, and reading the computer program by other computers through a network.

As a computer 400, there may be used a personal computer, a desk-top type computer, a note-book type computer, a mobile computer, a lap-top type computer, a pocket computer, a server computer, a client computer, a workstation, a host computer, a commercially available computer, and electronic exchanger, for instance.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-4731 filed on Jan. 13, 2000 including specification, claims, drawings and summary is incorporated herein by reference in its entirety.

What is claimed is:

1. A method of designating an output "don't care", comprising the steps of:

(a) reading first data about a logic circuit in which outputs associated a plurality of inputs are described;

(b) reading "don't care" indicating data which outputs a predetermined logic value in response only to a specific input among said plurality of inputs;

(c) converting said first data into second data having a form conforming to an application;

(d) converting said "don't care" indicating data into third data having said form;

(e) coupling said plurality of inputs in said second data to associated inputs in said third data; and (f) detecting an output in said second data which output is associated with an input in response to which said predetermined logic value is output from said "don't care" indicating data.

2. An apparatus for designating an output "don't care", comprising:

(a) a data reader which externally reads first logic circuit data in which outputs associated with a plurality of inputs are described, and "don't care" indicating data which outputs a predetermined logic value in response only to a specific input among said plurality of inputs;

(b) a data form converter which converts said first logic circuit data, and said "don't care" indicating data into second and third data, respectively, each having a form conforming to an application;

(c) a data coupler which couples said plurality of inputs in said second data to associated inputs in said third data; and (d) an output detector which detects an output in said second data which output is associated with an input in response to which said predetermined logic value is output from said "don't care" indicating data.

3. A processor comprising:

(a) an internal database storing logic circuit data therein;

(b) a data reader which externally reads (b1) first logic circuit data which is to be judged as to whether equivalent to reference data, (b2) second logic circuit data used as reference data in judgment of equivalency with other data, and (b3) "don't care" indicating data which receives the same inputs as inputs received in said second data and which outputs a predetermined logic value in response only to an input associated with a "don't care" output;

(c) a data form converter which converts said first logic circuit data, said second logic circuit data and said "don't care" indicating data into third, fourth and fifth data, respectively, each having a form conforming to an equivalency test;

(d) a data coupler which couples an input in said fourth data to an associated input in said fifth data;

(e) an output detector which detects an output in said fourth data which output is associated with an input in response to which said fifth data outputs said predetermined logic value; and (f) an equivalency tester which deems an output detected by said output detector, as an output having an undefined value, among outputs derived from said fourth data, and which judges whether an output derived from said third data is coincident with an output derived from said second data by comparing them to each other, with respect to outputs not detected by said output detector.

4. A method of processing logic circuit data, comprising the steps of:

(a) externally reading first logic circuit data which is to be judged as to whether equivalent to reference data, and storing the thus read first logic circuit data into an internal database;

(b) externally reading second logic data used as reference data in judgment of equivalency with other data, and storing the thus read second logic circuit data into said internal database;

(c) externally reading "don't care" indicating data which receives the same inputs as inputs received in said second logic circuit data and which outputs a predetermined logic value in response only to an input associated with a "don't care" output, and storing the thus read "don't care" indicating data into said internal database;

(d) converting said first logic circuit data into third data having a form conforming to an equivalency test;

(e) converting said second logic circuit data into fourth data having a form conforming to an equivalency test;

(f) converting said "don't care" indicating data into fifth data having a form conforming to an equivalency test;

(g) coupling an input in said fourth data to an associated input in said fifth data, and storing the thus coupled data into said internal database;

(h) detecting an output in said fourth data which output is associated with an input in response to which said fifth data outputs said predetermined logic value; and (i) deeming an output detected by said step (h), as an output having an undefined value, among outputs derived from said fourth data, and judging whether an output derived from said third data is coincident with an output derived from said second data by comparing them to each other, with respect to outputs not detected by said step (h).

5. A processor comprising:

(a) an internal database storing logic circuit data therein;

(b) a data reader which externally reads (b1) original logic circuit data, and (b2) "don't care" indicating data which outputs a predetermined logic value in response only to a specific input among a plurality of outputs derived from said original logic circuit data;

(c) a data form converter which converts said original logic circuit data and said "don't care" indicating data into first and second data, respectively, each having a form conforming to synthesis of logic;

(d) a data coupler which couples an input in said first data to an associated input in said second data;

(e) an output detector which detects an output derived from said first data which output is associated with an input in response to which said second data outputs said predetermined logic value, and converts the thus detected output into an undefined output as third data; and (f) a logic synthesizer which reads said third data thereinto for logic synthesis to thereby produce resultant synthesized logic circuit data.

6. A method of processing logic circuit data, comprising the steps of:

(a) externally reading original logic data, and storing the thus read original logic data into an internal database;

(b) externally reading "don't care" indicating data which outputs a predetermined logic value in response only to a specific input among a plurality of outputs derived from said original logic circuit data, and storing the thus read "don't care" indicating data into said internal database;

(c) converting said original logic circuit data into first data having a form conforming to synthesis of logic;

(d) converting said "don't care" indicating data into second data having a form conforming to synthesis of logic;

(e) coupling an input in said first data to an associated input in said second data;

(f) detecting an output derived from said first data which output is associated with an input in response to which said second data outputs said predetermined logic value, and converting the thus detected output into an undefined output as third data; and (g) synthesizing logic in accordance with said third data to thereby produce resultant synthesized logic circuit data.

7. A recording medium readable by a computer, storing a program therein for causing a computer to carry out a method of designating an output "don't care", said method comprising the steps of:

(a) reading first data about a logic circuit in which outputs associated a plurality of inputs are described;

(b) reading "don't care" indicating data which outputs a predetermined logic value in response only to a specific input among said plurality of inputs;

(c) converting said first data into second data having a form conforming to an application;

(d) converting said "don't care" indicating data into third data having said form;

(e) coupling said plurality of inputs in said second data to associated inputs in said third data; and (f) detecting an output in said second data which output is associated with an input in response to which said predetermined logic value is output from said "don't care" indicating data.

8. A recording medium readable by a computer, storing a program therein for causing a computer to carry out a method of processing logic circuit data, said method comprising the steps of:

(a) externally reading first logic circuit data which is to be judged as to whether equivalent to reference data, and storing the thus read first logic circuit data into an internal database;

(b) externally reading second logic data used as reference data in judgment of equivalency with other data, and storing the thus read second logic circuit data into said internal database;

(c) externally reading "don't care" indicating data which receives the same inputs as inputs received in said second logic circuit data and which outputs a predetermined logic value in response only to an input associated with a "don't care" output, and storing the thus read "don't care" indicating data into said internal database;

(d) converting said first logic circuit data into third data having a form conforming to an equivalency test;

(e) converting said second logic circuit data into fourth data having a form conforming to an equivalency test;

(f) converting said "don't care" indicating data into fifth data having a form conforming to an equivalency test;

(g) coupling an input in said fourth data to an associated input in said fifth data, and storing the thus coupled data into said internal database;

(h) detecting an output in said fourth data which output is associated with an input in response to which said fifth data outputs said predetermined logic value; and (i) deeming an output detected by said step (h), as an output having an undefined value, among outputs derived from said fourth data, and judging whether an output derived from said third data is coincident with an output derived from said second data by comparing them to each other, with respect to outputs not detected by said step (h).

9. A recording medium readable by a computer, storing a program therein for causing a computer to carry out a method of processing logic circuit data, said method comprising the steps of:

(a) externally reading original logic data, and storing the thus read original logic data into an internal database;

(b) externally reading "don't care" indicating data which outputs a predetermined logic value in response only to a specific input among a plurality of outputs derived from said original logic circuit data, and storing the thus read "don't care" indicating data into said internal database;

(c) converting said original logic circuit data into first data having a form conforming to synthesis of logic;

(d) converting said "don't care" indicating data into second data having a form conforming to synthesis of logic;

(e) coupling an input in said first data to an associated input in said second data;

(f) detecting an output derived from said first data which output is associated with an input in response to which said second data outputs said predetermined logic value, and converting the thus detected output into an undefined output as third data; and (g) synthesizing logics in accordance with said third data to thereby produce resultant synthesized logic circuit data.

10. A recording medium readable by a computer, storing a program therein for causing a computer to act as an apparatus for designating an output "don't care", said apparatus comprising:

(a) a data reader which externally reads first logic circuit data in which outputs associated with a plurality of inputs are described "don't care" indicating data which outputs a predetermined logic value in response only to a specific input among said plurality of inputs;

(b) a data form converter which converts said first logic circuit data, and said "don't care" indicating data into second and third data, respectively, each having a form conforming to an application;

(c) a data coupler which couples said plurality of inputs in said second data to associated inputs in said third data; and (d) an output detector which detects an output in said second data which output is associated with an input in response to which said predetermined logic value is output from said "don't care" indicating data.

11. A recording medium readable by a computer, storing a program therein for causing a computer to act as a processor, said processor comprising:

(a) an internal database storing logic circuit data therein;

(b) a data reader which externally reads (b1) first logic circuit data which is to be judged as to whether equivalent to reference data, (b2) second logic circuit data used as reference data in judgment of equivalency with other data, and (b3) "don't care" indicating data which receives the same inputs as inputs received in said second data and which outputs a predetermined logic value in response only to an input associated with a "don't care" output;

(c) a data form converter which converts said first logic circuit data, said second logic circuit data and said "don't care" indicating data into third, fourth and fifth data, respectively, each having a form conforming to an equivalency test;

(d) a data coupler which couples an input in said fourth data to an associated input in said fifth data;

(e) an output detector which detects an output in said fourth data which output is associated with an input in response to which said fifth data outputs said predetermined logic value; and (f) an equivalency tester which deems an output detected by said output detector, as an output having an undefined value, among outputs derived from said fourth data, and which judges whether an output derived from said third data is coincident with an output derived from said second data by comparing them to each other, with respect to outputs not detected by said output detector.

12. A recording medium readable by a computer, storing a program therein for causing a computer to act as a processor, said processor comprising:

(a) an internal database storing logic circuit data therein;

(b) a data reader which externally reads (b1) original logic circuit data, and (b2) "don't care" indicating data which outputs a predetermined logic value in response only to a specific input among a plurality of outputs derived from said original logic circuit data;

(c) a data form converter which converts said original logic circuit data and said "don't care" indicating data into first and second data, respectively, each having a form conforming to synthesis of logic;

(d) a data coupler which couples an input in said first data to an associated input in said second data;

(e) an output detector which detects an output derived from said first data which output is associated with an input in response to which said second data outputs said predetermined logic value, and converts the thus detected output into an undefined output as third data; and (f) a logic synthesizer which reads said third data thereinto for logic synthesis to thereby produce resultant synthesized logic circuit data.

* * * * *